United States Patent

Dale

[15] 3,697,830

[45] Oct. 10, 1972

[54] SEMICONDUCTOR SWITCHING DEVICE

[72] Inventor: Brian Dale, West Peabody, Mass.

[73] Assignee: GTE Sylvania Incorporated

[22] Filed: Aug. 10, 1964

[21] Appl. No.: 388,575

[52] U.S. Cl. .317/235 R, 317/235 AB, 317/235 AM, 307/305

[51] Int. Cl. ............................H01l 9/12, H01l 11/10

[58] Field of Search .......................317/235; 307/88.5

[56] References Cited

UNITED STATES PATENTS

| | | | |
|---|---|---|---|
| 3,223,904 | 12/1965 | Warner | 317/235 |
| 3,237,062 | 2/1966 | Murphy | 317/234 |
| 3,252,063 | 5/1966 | Ziffer | 317/235 |
| 3,253,197 | 5/1966 | Haas | 317/235 |
| 3,261,985 | 7/1966 | Somos | 307/88.5 |

*Primary Examiner*—Martin H. Edlow
*Attorney*—Norman J. O'Malley, Elmer J. Nealon and David M. Keay

[57] ABSTRACT

Semiconductor switching device having four zones of semiconductor material of alternating conductivity type with surface areas in a common surface. An ohmic gate connection to the one of the intermediate zones which is the gate at its surface area is located intermediate the ohmic connections to the terminal zones. Current flow from one terminal zone toward the other terminal zone adjacent the surface of the device while the device is "on" may be withdrawn at the gate connection before it reaches the vicinity of the other terminal zone in order to turn the device "off." The turn-off characteristics of the device are thereby improved.

2 Claims, 3 Drawing Figures

Figure 1:
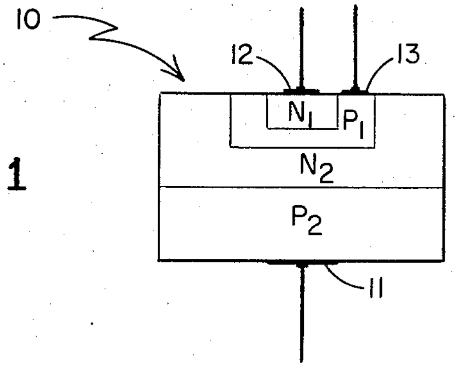

INVENTOR.
BRIAN DALE

BY David M. Keay

AGENT.

SEMICONDUCTOR SWITCHING DEVICE

This invention relates to semiconductor electrical translating devices. More particularly, it is concerned with semiconductor switching devices of the type known as PNPN, or four-layer, triodes.

Semiconductor devices having four successive layers, or zones, of semiconductor material of alternating conductivity type providing a three-junction device are well known. These devices, commonly referred to as PNPN switches, have a voltage-current characteristic across the terminals of the end zones which includes a negative resistance region intermediate between high impedance and low impedance positive resistance regions. This characteristic permits their use in a variety of switching applications.

PNPN switches which may be triggered from the high impedance-low conduction, or "off," condition to the low impedance-high conduction, or "on," condition include a gate connection at one of the intermediate zones of the device to which triggering pulses are applied. In the off condition the device has a current gain, or alpha, which is less than unity. Upon the application of a trigger pulse of the appropriate polarity to the gate, current starts to flow through the device. This action is regenerative, that is, the alpha of the device becomes greater than unity and remains greater than unity, as long as the current does not drop below a minimum holding current, even after the trigger pulse is terminated.

PNPN switches may also be of the type which can also be triggered from the on condition to the off condition by triggering pulses applied to the gate. The application of a trigger pulse of the appropriate polarity of momentary duration to the gate withdraws some of the current which is flowing through the device causing the alpha of the device to become less than unity. This action is regenerative and current flow through the device ceases.

For ease in considering the phenomena taking place in PNPN switches the device may be considered the equivalent of two three-zone complementary transistor sections having their bases and collectors cross-coupled. The transistor section having the gate connection to its base region may be called the control transistor section and the three-zone transistor section having the intermediate zone with no external connection may be called the floating transistor section. The alpha of the device is the sum of the alphas of the two transistor sections. In order to obtain low triggering current, good turn-off gain, and a low value of holding current in a PNPN bistable switching device the alpha of the control transistor section should be high, that is, only slightly less than unity, and the alpha of the floating transistor section should be low. In addition, the alphas of the two transistor sections should increase with increasing current at low values of current and should then become relatively independent of current.

However, in known bistable PNPN switches of this type the details of construction employed in attempting to produce a low value of alpha for the floating transistor section do not provide the low value of holding current and the degree of triggering sensitivity desired. In addition, in previously known devices the on current through the device which the device is capable of turning off is limited.

It is an object of the present invention, therefore, to provide an improved semiconductor switching device.

It is another object of the invention to provide a PNPN semiconductor triode bistable switching device having improved electrical characteristics.

It is also an object of the invention to provide a PNPN semiconductor triode bistable switching device having low holding current and good triggering sensitivity.

It is a further object of the invention to provide a PNPN semiconductor triode bistable switching device capable of turning off relatively substantial on currents flowing through the device.

Briefly, a semiconductor device in accordance with the foregoing objects of the invention comprises a body of semiconductor material having four zones of alternating conductivity type each having a surface area in a surface of the body. The first zone is of one conductivity type and a first ohmic connection makes contact at its surface area. The second zone is of the opposite conductivity type and lies intermediate the first zone and the remaining zones of the body. Its surface area encircles the surface area of the first zone and a second ohmic connection makes contact at the surface area. The third zone is of the one conductivity type and lies intermediate the first and second zones and the fourth zone. Its surface area in the surface of the body is contiguous the surface area of the second zone. The fourth zone is of the opposite conductivity type and is contiguous the third zone. It has a surface area in the surface of the body and a third ohmic connection makes contact at the surface area. The distance between the fourth zone and the second ohmic connection is less than the distance between the fourth zone and the first zone.

Figure 2:
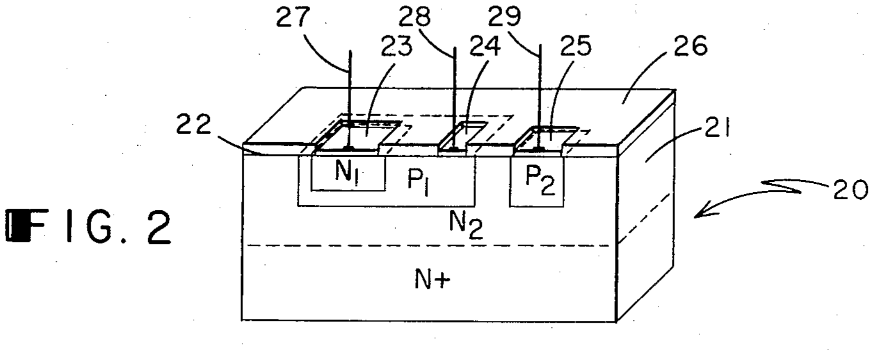
PRIOR ART FIG. 2
Figure 3:
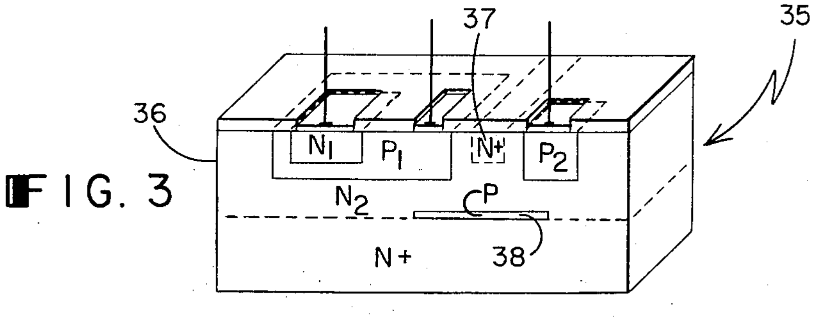

Additional objects, features, and advantages of devices according to the invention will be apparent from the following detailed discussion and accompanying drawings wherein:

FIG. 1 is a cross-section view of a four-layer semiconductor switching device of the prior art type, FIG. 2 is a perspective view in elevational cross-section of a PNPN semiconductor switching device according to the invention, and FIG. 3 is a perspective view in elevational cross-section illustrating a second embodiment of a PNPN switching device according to the invention.

In the figures the various parts of the semiconductor elements are not drawn to scale. Certain dimensions are exaggerated in relation to other dimensions in order to present a clearer understanding of the invention.

Although for the purposes of the present discussion PNPN triodes are shown in which the gate connection is made to the intermediate P-type zone and the intermediate N-type zone is free of any connection, it is well understood the teachings herein are equally applicable to PNPN triodes in which the conductivity type of the zones is reversed and the gate connection is made to an N-type zone.

A PNPN switching device 10 of a type known in the prior art is shown in FIG. 1. The device may be considered as equivalent to a complementary pair of transistors with the bases and collectors cross-coupled. The first three zones $N_1$, $P_1$, and $N_2$ constitute the control transistor section, and the last three zones $P_2$, $N_2$, and $P_1$ constitute the floating transistor section. The $N_1$ zone is the emitter region of the control or NPN transistor section and the $N_1$–$P_1$ junction is its emitter junction. The $P_2$ zone is the emitter region of the floating or PNP transistor section and the $N_2$–$P_2$ junction is its emitter junction. The $P_1$–$N_2$ junction is the collector junction for both transistor sections.

Each transistor section has a current gain or alpha and the alpha of the device is equal to their sum ($\alpha_T = \alpha_{NPN} + \alpha_{PNP}$). The alpha of the device ($\alpha_T$) varies with current through the device from less than unity in the off condition to greater than unity in the on condition. The alpha is equal to unity when the current through the device is at the holding current, which is the minimum current through the device sufficient to sustain the device in the on condition.

In order to switch the device from the off to the on condition, gate current is introduced into the device at the $P_1$ zone sufficient to cause an increase in current flow through the device to a level which raises the alpha of the device to unity. Current flow at the emitter of the second transistor section is equal to the current at the gate multiplied by $\alpha_{NPN}/(1-\alpha_{NPN}-\alpha_{PNP})$. Therefore, in order that the turn-on current may be small, the value of the $\alpha_{NPN}$ should become high as current starts to flow through the device. The value of $\alpha_{NPN}$ should increase very rapidly with increasing current through the device so that only a small current need be introduced at the $P_1$ zone to raise the value of $\alpha_T$ above unity and switch the device on.

The turn-off gain of the device, which is the ratio of the on current through the device being switched off to the current at the $P_1$ zone necessary to accomplish the switching, is approximately equal to $\alpha_{NPN}/(\alpha_{NPN}+\alpha_{PNP}-1)$. Thus, in order for the turn-off gain to be high, $\alpha_{NPN}$ should be high and $\alpha_{PNP}$ should be low so that $\alpha_{NPN}+\alpha_{PNP}$ is only slightly greater than unity when the device is in the on condition. With the $\alpha_T$, or the sum of $\alpha_{NPN}+\alpha_{PNP}$, only slightly greater than unity, the device does not operate in a heavily saturated condition. For this reason the gate current which must be withdrawn at the $P_1$ zone to turn the device off is small.

The prior art switching device 10 as illustrated in FIG. 1 may be fabricated by the double diffusion of conductivity type imparting materials into epitaxially grown semiconductor material. The $P_2$ zone may be formed by the epitaxial deposition of a layer of P-type semiconductor material on a substrate of degenerate P-type semiconductor material. An epitaxial layer of N-type semiconductor material is then deposited on the P-type epitaxial layer. A P-type region is then formed in a portion of the N-type epitaxial layer by diffusion of a suitable conductivity type imparting material into the layer at a limited area on the surface of the layer. Then an N-type region is formed in a portion of the diffused P-type region by diffusion of a suitable conductivity type imparting material into the region at a limited area of the surface. Thus, a PNPN device having a double-diffused N-type zone $N_1$, a diffused P-type zone $P_1$, a zone of epitaxially grown N-type material $N_2$, and a diffused P-type zone $P_2$ is produced. An anode connection 11 is made to the $P_2$ zone, a cathode connection 12 to the $N_1$ zone, and a gate connection 13 to the $P_1$ zone.

As stated hereinabove, in order for the turn-off gain of the device to be high, the alpha of the floating transistor section ($\alpha_{PNP}$) must be low. However, in devices of the foregoing prior art type fabricated in accordance with known techniques a value of $\alpha_{PNP}$ which provides high turn-off gain and low holding current to the desired degree has not been readily obtainable.

In addition, in devices of the type illustrated in FIG. 1, the current through the device in the on condition which can be turned off by the device is limited. The limitation occurs because as a negative potential is applied to the gate connection 13, current flows laterally across the narrow $P_1$ zone toward the gate. This current flow creates a potential gradient in the $P_1$ zone and the $N_1$—$P_1$ junction in the region adjacent the gate connection becomes reverse biased. If the gate current increases to a critical value, the $N_1$—$P_1$ junction is forced into breakdown near the gate connection. The maximum current through the device which can be turned off by the device is that corresponding to the critical value of gate current which causes breakdown.

PNPN bistable switching triodes according to the invention have good turn-on and turn-off gain and avoid the problem of limited device current which can be turned off. A first embodiment of a PNPN device 20 according to the invention is illustrated in FIG. 2. The device includes a body of semiconductor material 21 having a region of low resistivity N-type material N+. Adjoining the low resistivity N-type region N+ is a region $N_2$ of high resistivity N-type material. Portions of this region extend to the upper surface 22 of the body which is flat and parallel to the interface between the $N_2$ region and the N+ region.

A P-type region $P_1$ in the body also has a surface area in the surface of the body. Within and surrounded by the $P_1$ region is another N-type region $N_1$. The $N_1$ region has a surface area in the surface of the body encircled by the surface area of the $P_1$ region. Another P-type region $P_2$ contiguous the high resistivity $N_2$ region has a surface area in the surface 22 of the body which is encircled by the surface area of the $N_2$ region. The $P_2$ region is separated from the $P_1$ region by the $N_2$ region.

As shown in FIG. 2 the $N_1$ region is located with respect to the other regions such that the major portion of the $P_1$ region lies between the $N_1$ region and the $P_2$ region. Ohmic contacts 23, 24, and 25 are connected to the surface 22 of the body at the surface areas of the $N_1$ region, the $P_1$ region, and $P_2$ region to provide cathode, gate, and anode connections, respectively. The gate connection is located intermediate the cathode and anode connections.

PNPN triodes as illustrated in FIG. 2 may be produced by a combination of epitaxial deposition techniques and the selective diffusion of conductivity type imparting materials. The device may be fabricated in a slice of low resistivity or degenerate N-type single crystal silicon which provides a large number of devices. A layer of single crystal silicon of high resistivity N-type conductivity is deposited on the slice using known epitaxial deposition techniques.

An adherent protective silicon oxide coating is formed on the surface of the epitaxial layer. Openings are made in this oxide coating by photoresist and etching techniques to expose two areas of a surface of the layer for each device. Boron is diffused through these openings to convert the underlying regions to P-type conductivity. Next, the oxide coating is reconstituted and one opening for each device is formed in the coating to expose a surface area within the surface area of one of the diffused P-type regions. Phosphorus is diffused through the opening to convert the underlying portion of the diffused P-type region to N-type conductivity. Openings are then formed in the oxide coating to expose a portion of the surface area of the double-diffused N-type region and each of the diffused P-type regions of each device. Aluminum is then deposited on these exposed surface areas to provide ohmic contacts to the underlying regions.

In the device illustrated in FIG. 2 the N+ region is the silicon substrate, and the remainder of the semiconductor body is the epitaxially grown layer. The $N_1$ region is the double-diffused N-type region, and the $P_1$ and $P_2$ regions are the diffused P-type regions. The remaining portion of the epitaxial layer is the $N_2$ region. The edges of all the junctions at the surface underlie the oxide coating 26. Aluminum contacts 23, 24, and 25 deposited on the surface of the body through openings in the oxide coating together with the lead wires 27, 28, and 29 provide the cathode, the gate, and the anode connections, respectively, to the device.

When the device is in the off condition it is turned on by a positive pulse applied to the gate 28. Electrons flow downward from the $N_1$ emitter region of the $N_1P_1N_2$ transistor section and across the thin $P_1$ base region to the $N_2$ collector region. The electron current then flows laterally through the low resistivity N+ material and then upwards toward the $P_2$ region. The upward flow of current in the $N_2$ region becomes base current for the $P_2N_2P_1$ transistor section. The $P_2$ emitter region is thereby caused to emit holes which flow across the $N_2$ region to be collected by the $P_1$ collector region. The action in the device is thus regenerative, or in other words, the alpha of the device becomes greater than unity, and the device is switched to the fully on condition.

The device is turned off by a suitable pulse applied to the gate 28. A pulse of cathode potential is satisfactory. In the on condition current flowing from the $P_2$ region to the $N_1$ region passes adjacent the gate contact 24 before reaching the $N_1$—$P_1$ junction. Therefore, current withdrawn from the $P_1$ region at the gate does not pass adjacent any portion of the $N_1$—$P_1$ junction. Thus, regardless of the amount of current flowing through the device the path of current flow to the gate does not establish a potential gradient in the $P_1$ region which has any effect on the $N_1$—$P_1$ junction. Any amount of on current can flow through the device, so long as the current handling capability of the semiconductor body is not exceeded, and can be withdrawn at the gate with no possibility of creating a breakdown voltage condition across the $P_1$—$N_1$ junction.

In addition, the $P_2N_2P_1$ transistor section is fabricated adjacent the surface of the body of semiconductor material and the P-type regions are of graded resistivity. The alpha of the $P_2N_2P_1$ transistor section is very low. With this configuration of the transistor section the alpha first rises at low current levels and then drops with increasing current. Thus, the $\alpha_T$ passes through unity at a low current level, peaks at a value slightly greater than unit, and then slowly decreases with increasing current. This feature provides low holding current and good turn-off sensitivity.

Another advantage of the device illustrated is the low voltage drop across the device in the on condition. The high resistivity $N_2$ region, the thickness of which is determined by the thickness of the N-type epitaxial layer and the depth of diffusion of the P-type regions, is very thin. The major portion of the distance current flows through the device takes place laterally in the N+ substrate region which is of very low resistivity. Thus the total series resistance of the device in the on condition is very low.

In a typical PNPN switching triode according to the embodiment of FIG. 2 the body 21 of the device is fabricated employing a degenerate substrate N+ 6 mils thick of single crystal N-type silicon heavily doped with phosphorus to provide a resistivity of approximately 0.007 ohm-centimeters. An N-type conductivity layer approximately 10 microns thick is grown on the substrate. The silicon is moderately doped with phosphorus to provide a resistivity of about 1 ohm-centimeter.

Following the epitaxial deposition process, P and N-type regions are successively diffused into the N-type epitaxial layer. Boron is diffused through two rectangular openings in an oxide coating on the surface of the N-type layer to produce P-type regions of graded resistivity. Phosphorus is then diffused through an opening in the reconstituted oxide coating to produce an N-type region of graded resistivity. The double-diffused N-type region is the $N_1$ region of FIG. 2. The remaining portion of the diffused P-type region encircling the $N_1$ region is the $P_1$ region. The other diffused P-type region is the $P_2$ region. The remaining portion of the N-type epitaxial layer not altered by diffusion is the $N_2$ region.

The boron is diffused through rectangular openings 2 mils by 10 mils and 6 mils by 10 mils. The two openings are spaced apart approximately 0.9 mil. Phosphorus is diffused through a rectangular opening 2 mils by 9 mils. The opening is located so that the $N_1$—$P_1$ junction is approximately 3.0 mils from the portion of the $P_1$—$N_2$ junction nearest the $P_2$ region. The diffused $P_1$ and $P_2$ regions extend into the epitaxial layer to provide graded junctions approximately 5 microns from the surface, and the diffused $N_1$ region extends to a depth of approximately 2.5 microns. Openings are made in the oxide coating and aluminum is deposited on the exposed surface areas to provide ohmic contacts 23, 24, and 25 to the $N_1$, $P_1$, and $P_2$ regions, respectively. The contact 24 to the $P_1$ region is located at the portion of the surface area intermediate the $N_1$ region and the portion of the $P_1$—$N_2$ junction nearest the $P_2$ region.

A second embodiment of a PNPN bistable switching triode 35 according to the invention is illustrated in FIG. 3. In this modification the $P_2$ region is located within the body 36 of semiconductor material at a distance from the $P_1$ region which is greater than the corresponding distance in the device of FIG. 2. A strip or band 37 of low resistivity N-type material extends across the device at the surface intermediate the two P-type regions. The band is formed by diffusion of N-type conductivity imparting material through a suitable opening in the oxide coating at the time the $N_1$ region is formed. The heavily doped N-type material of the band serves to block the formation of P-type "channels" along the surface of the high resistivity $N_2$ region between the $P_1$ and $P_2$ regions in accordance with the teachings in application Ser. No. 319,767, filed Oct. 29, 1963, in the name of Thomas A. Longo entitled "-Semiconductor Device and Method of Manufacture" and assigned to the assignee of the present invention.

Since the portion of the $N_2$ region between the $P_2$ and $P_1$ regions is the base region of the $P_2N_2P_1$ transistor section, its width affects the alpha of the transistor section. The spacing required between the two P-type regions in order to accommodate the N+ band 37 causes the value of alpha to be very low. Under certain circumstances the alpha of the $P_2N_2P_1$ transistor section might be too low to provide regenerative action in the device.

In order to obtain a desired value of alpha for the $P_2N_2P_1$ transistor section independent of the spacing between the two P-type regions, an internal or buried region 38 of P-type conductivity underlying portions of the $P_1$ and $P_2$ regions and the portion of the $P_2$ region between the $P_1$ and $P_2$ regions may be provided. This region may be produced by the epitaxial deposition of a P-type layer on a surface area of the N+ substrate delineated by a suitable mask prior to the epitaxial deposition of the high resistivity N-type layer. The buried P-type region 38 extends across the device for sufficient distance to underlie the portion of the $N_2$ region between the $P_1$ and $P_2$ regions.

The buried P-type region 38 provides a path of current flow from the $P_2$ to the $P_1$ region in which the shortest distance through the N-type base region $N_2$ is the sum of the distances from the $P_2$ region to the buried P-type region and from the $P_1$ region to the buried P-type region rather than the distance from the $P_2$ to the $P_1$ region directly. The internal P-type region 38 serves both both as a collector of positive holes emitted by the $P_2$ region and as a re-emitter of holes to the $P_1$ region. In effect, the region 38 acts as a low resistance shunt decreasing the resistance to current flow along the predominately lateral path between the $P_2$ and the $P_1$ regions. Thus, the alpha of the $P_2N_2P_1$ transistor section is determined not by the lateral spacing between the $P_1$ and $P_2$ regions but by the vertical spacing between the buried P-type region and the $P_1$ and $P_2$ regions. The degree of control obtainable with epitaxial deposition and conductivity type imparting material diffusion techniques is such that a desirable value of alpha for the $P_2N_2P_1$ transistor section may be obtained. In addition, a device as shown in FIG. 3 retains the advantages of devices according to the embodiment of FIG. 2 as described hereinabove including the ability to turn off any amount of on current flowing through the device.

What is claimed is:

1. A semiconductor device comprising
a body of semiconductor material;
a first zone of the body of one conductivity type having a surface area in a surface of the body;
a second zone of the body of the opposite conductivity type, said second zone lying intermediate the first zone and the remainder of the body and having a surface area in said surface of the body encircling the surface area of the first zone;
a third zone of the body of the opposite conductivity type, said third zone being spaced from said first and second zones and having a surface area in said surface of the body spaced from the surface area of the first and second zones;
a fourth zone of the body of the one conductivity type, said fourth zone being contiguous said second zone and contiguous said third zone, and having a surface area in said surface of the body encircling the surface area of the second zone and encircling the surface area of the third zone;
a region of the body of the opposite conductivity type separated from the second zone and the third zone by the fourth zone;
the total of the shortest distances between the second zone and said region and between the third zone and said region being less than the shortest distance between the second zone and the third zone;
an ohmic connection to the surface area of the first zone;
an ohmic connection to the surface area of the second zone;
an ohmic connection to the surface area of the third zone;
the first, second, and fourth zones having an effective alpha which is high but less than unity and the second, fourth, and third zones having an effective alpha which is low, the sum of said alphas becoming greater than unity when current flows into said second zone from the ohmic connection to the second zone causing current to flow through the device;
the ohmic connection to the second zone being located intermediate the ohmic connections to the first and third zones whereby current flowing through the device from the third zone toward the first zone passes adjacent the ohmic connection to the second zone before reaching the first zone.

2. A semiconductor device comprising
a body of semiconductor material including
a substrate of semiconductor material of one conductivity type of low resistivity;
a layer of semiconductor material contiguous said substrate and having a flat surface substantially parallel to the interface between said substrate and said layer;
said layer including a first zone of one conductivity type of graded resistivity having a surface area in said surface of the layer;
said layer including a second zone of the opposite conductivity type of graded resistivity, said second zone lying contiguous said first zone and intermediate the first zone and the remainder of said layer, and having a surface area in said surface of the layer encircling the surface area of the first zone;
said layer including a third zone of the opposite conductivity type of graded resistivity, said third zone being spaced from said first and second zones and having a surface area in said surface of the layer spaced from the surface area of the first and second zones;
said layer including a region of the one conductivity type, said region being contiguous said substrate, said second zone, and said third zone, and having a surface area in said surface encircling the surface area of the second zone and encircling the surface area of the third zone;

said region including a band of the one conductivity type of low resistivity lying intermediate and spaced from said second and third zones and having a surface area in said surface, the remainder of said region of the one conductivity type being of high resistivity;

said layer including a region of the opposite conductivity type separated from the second zone and from the third zone by said region of the one conductivity type;

the total of the shortest distance between the second zone and said region of the opposite conductivity type and between the third zone and said region of the opposite conductivity type being less than the shortest distance between the second zone and the third zone;

an ohmic connection to the surface area of the first zone;

an ohmic connection to the surface area of the third zone; and an ohmic connection to the surface area of the second zone intermediate the ohmic connections to the first and third zones.

* * * * *